United States Patent
Feng et al.

(10) Patent No.: US 10,784,791 B2
(45) Date of Patent: Sep. 22, 2020

(54) DRIVING CIRCUIT ALLOWING EFFICIENT TURNING-OFF OF SYNCHRONOUS RECTIFIERS

(71) Applicant: Chengdu Monolithic Power Systems Co. Ltd., Chengdu (CN)

(72) Inventors: Lin Feng, Chengdu (CN); Jiayou Ye, New Taipei (TW)

(73) Assignee: Chengdu Monolithic Power SYstems Co., Ltd., Chengdu (CN)

( * ) Notice: Subject to any disclaimer, the term of this patent is extended or adjusted under 35 U.S.C. 154(b) by 0 days.

(21) Appl. No.: 16/442,439

(22) Filed: Jun. 14, 2019

(65) Prior Publication Data

US 2019/0393794 A1    Dec. 26, 2019

(30) Foreign Application Priority Data

Jun. 21, 2018 (CN) .......................... 2018 1 0641012

(51) Int. Cl.
*H02M 3/335* (2006.01)

(52) U.S. Cl.
CPC .... *H02M 3/33592* (2013.01); *H02M 3/33576* (2013.01)

(58) Field of Classification Search
CPC ....................... H02M 3/33576; H02M 3/33592
USPC ....... 323/274, 275; 363/21.04, 21.14, 78, 79
See application file for complete search history.

(56) References Cited

U.S. PATENT DOCUMENTS

| | | | | |
|---|---|---|---|---|
| 7,450,402 B2 * | 11/2008 | Jitaru | ................ | H02M 3/33584 363/17 |
| 8,102,680 B2 * | 1/2012 | Ren | .................... | H02M 3/33592 363/21.06 |
| 8,416,587 B2 * | 4/2013 | Chen | ................. | H02M 3/33592 363/127 |
| 8,526,202 B2 * | 9/2013 | Fang | ................. | H02M 3/33592 363/127 |
| 2012/0300520 A1 * | 11/2012 | Ren | ......................... | H02M 1/32 363/127 |
| 2014/0334205 A1 * | 11/2014 | Zhang | .................. | H05B 45/382 363/89 |
| 2016/0072399 A1 * | 3/2016 | Kikuchi | .................. | H02M 1/32 363/21.14 |
| 2019/0165686 A1 | 5/2019 | Wang | | |

* cited by examiner

*Primary Examiner* — Gary A Nash
(74) *Attorney, Agent, or Firm* — Perkins Coie LLP

(57) ABSTRACT

A driving circuit and driving method for driving a synchronous rectifier. When a drain-source detecting voltage between a drain terminal and a source terminal of the synchronous rectifier reaches a second reference voltage, the driving voltage applied at a gate terminal of the synchronous rectifier is decreased to regulate the drain-source detecting voltage to a first reference voltage. The first reference voltage is lower than the second reference voltage. And when the drain-source detecting voltage reaches an off reference voltage, the synchronous rectifier is turned off.

20 Claims, 5 Drawing Sheets

DRIVING CIRCUIT ALLOWING EFFICIENT TURNING-OFF OF SYNCHRONOUS RECTIFIERS

CROSS-REFERENCE TO RELATED APPLICATIONS

This application claims the benefit of CN application No. 201810641012.0, filed on Jun. 21, 2018, and incorporated herein by reference.

FIELD OF THE INVENTION

The present invention relates generally to electronic circuits, more specifically but not exclusively to synchronous rectification.

BACKGROUND OF THE INVENTION

In a synchronous rectifying switching power supply, there is a synchronous rectifier which can be equivalent to an ideal transistor and a parasitic inductor that are serially coupled. The real drain-source voltage $V_{DS}$ between the drain terminal and the source terminal of the ideal transistor is needed to be sampled and further regulated by a driving circuit to a preset value so that the output voltage of the synchronous rectifying switching power supply is regulated to a desired target value. In addition, the real drain-source voltage $V_{DS}$ is compared with a reverse voltage threshold and when the drain-source voltage reaches the reverse voltage threshold, the ideal transistor is turned off to avoid a reverse current.

As it is difficult to sample the real drain-source voltage $V_{DS}$ between the drain terminal and the source terminal of the ideal transistor. A regular way is to sample the drain-source detecting voltage $V_{DSS}$ between the drain terminal and the source terminal of the synchronous rectifier which practically comprises the voltage drop $V_{LP}$ across the parasitic inductor of the synchronous rectifier in addition to the real drain-source voltage $V_{DS}$ of the ideal transistor. Especially, when the current flowing through the parasitic inductor is relatively large and/or the inductance of the parasitic inductor is relatively large, the voltage drop $V_{LP}$ can be large, resulting a large difference between the drain-source detecting voltage $V_{DSS}$ and the real drain-source voltage $V_{DS}$.

As a result, if the synchronous rectifier is turned off when the drain-source detecting voltage $V_{DSS}$ reaches the reverse voltage threshold, the efficiency will be low as this turn-off moment is actually ahead of the moment at which the real drain-source voltage $V_{DS}$ reaches the reverse voltage threshold.

A traditional way to prevent false triggering is to decrease the driving voltage applied at the gate terminal of the synchronous rectifier so as to regulate the drain-source detecting voltage $V_{DSS}$ at the preset value when the drain-source detecting voltage $V_{DSS}$ reaches the preset value. Accordingly, the on-resistance of the synchronous rectifier SR is increased, which in turn reduces or eliminates the increase of the drain-source detecting voltage VDSS due to the decrease of the current flowing through the synchronous rectifier SR. As a result, the moment at which the synchronous rectifier SR is turned off when the drain-source detecting voltage VDSS reaches the reverse threshold voltage is closer to the ideal turn-off moment. However, the traditional way is inefficient.

Thus, there's a need to address at least the above mentioned or other issues.

SUMMARY

Embodiments of the present invention are directed to a driving circuit for driving a synchronous rectifier, wherein the synchronous rectifier is configured to comprise a drain terminal, a source terminal and a gate terminal, and a drain-source detecting voltage exists between the drain terminal and the source terminal, and wherein the driving circuit is configured to regulate the drain-source detecting voltage at a first reference voltage when the drain-source detecting voltage reaches a second reference voltage, wherein the first reference voltage is lower than the second reference voltage.

Embodiments of the present invention are also directed to a synchronous rectifying switching power supply, comprising: a primary circuit configured to receive an input signal and to provide an primary signal; a transformer having a primary winding and a secondary winding, wherein the primary winding is electrically coupled to the primary circuit to receive the primary signal; a synchronous rectifier electrically coupled between the secondary winding and a load, wherein the synchronous rectifier is configured to comprise a drain terminal, a source terminal and a gate terminal, and a drain-source detecting voltage exists between the drain terminal and the source terminal; and a driving circuit for driving the synchronous rectifier, wherein the driving circuit is configured to regulate the drain-source detecting voltage at a first reference voltage when the drain-source detecting voltage reaches a second reference voltage, wherein the first reference voltage is lower than the second reference voltage.

Embodiments of the present invention are further directed to a driving method for driving a synchronous rectifier, wherein the synchronous rectifier is configured to comprise a drain terminal, a source terminal and a gate terminal, and a drain-source detecting voltage exists between the drain terminal and the source terminal, and wherein the driving method comprises regulating the drain-source detecting voltage at a first reference voltage when the drain-source detecting voltage reaches a second reference voltage, wherein the first reference voltage is lower than the second reference voltage.

DESCRIPTION OF THE DRAWINGS

The present invention can be further understood with reference to the following detailed description and the appended drawings, wherein like elements are provided with like reference numerals.

DESCRIPTION

Figure 1:
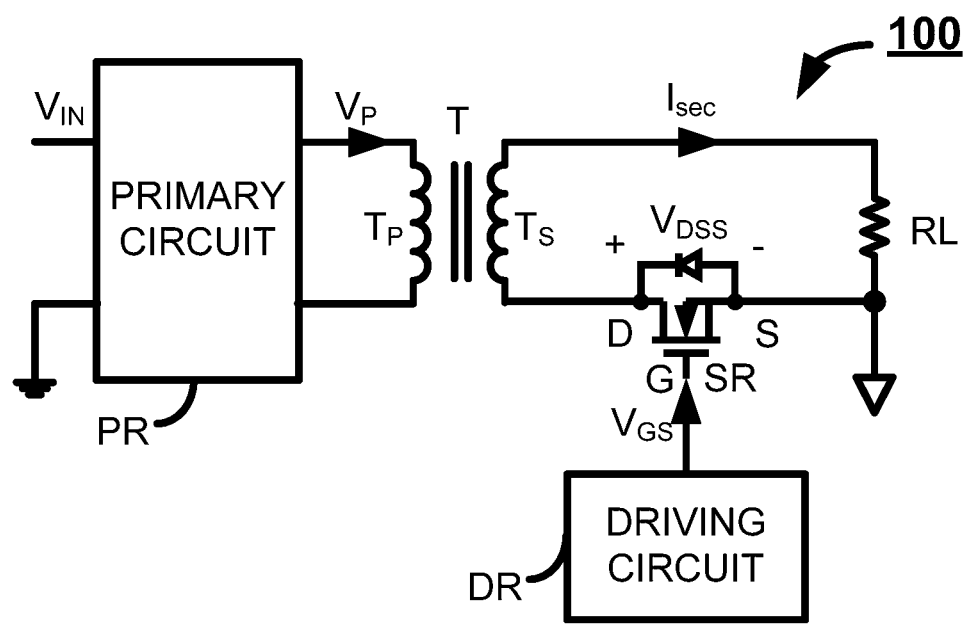
FIG. 1 illustrates a synchronous rectifying switching power supply 100 in accordance with an embodiment of the present invention.

The present invention is now described. While it is disclosed in its preferred form, the specific embodiments of the invention as disclosed herein and illustrated in the drawings are not to be considered in a limiting sense. Rather, these embodiments are provided so that this invention will be thorough and complete, and will fully convey the scope of the invention to those skilled in the art. Indeed, it should be readily apparent in view of the present description that the invention may be modified in numerous ways. Among other things, the present invention may be embodied as devices, methods, software, and so on. Accordingly, the present invention may take the form of an entirely hardware embodiment, an entirely software embodiment or one embodiment combining software and hardware aspects. The following detailed description is, therefore, not to be taken in a limiting sense.

Throughout the specification, the meaning of "a," "an," and "the" may also include plural references.

FIG. 1 illustrates a synchronous rectifying switching power supply 100 in accordance with an embodiment of the present invention. As shown in FIG. 1, the synchronous rectifying switching power supply 100 is illustrated to comprise a primary circuit PR, a transformer T, a synchronous rectifier SR and a driving circuit DR. Specifically, the primary circuit PR is configured to receive an input signal VIN and then to convert the input signal VIN into a primary signal $V_P$. The transformer T is configured to comprise a primary winding TP and a secondary winding TS, wherein the primary winding TP is electrically coupled to the primary circuit PR to receive the primary signal $V_P$. The primary signal $V_P$ can be a DC signal or an AC signal. The synchronous rectifier SR is electrically coupled between the secondary winding TS and a load RL. As shown in FIG. 1, the synchronous rectifier SR comprises a drain terminal D, a source terminal S and a gate terminal G, wherein the drain terminal D is electrically coupled to a first terminal of the secondary winding TS, and the source terminal S is electrically coupled to a first terminal of the load RL and a reference ground. Persons of ordinary skill in the art will recognize that, in another embodiment, the source terminal S of the synchronous rectifier SR may be coupled to the first terminal of the secondary winding TS, the drain terminal D may be coupled to the first terminal of the load RL. The driving circuit DR is electrically coupled to the gate terminal G of the synchronous rectifier SR so as to provide a gate voltage $V_{GS}$ to control the turn-on, turn-off and/or the value of the on-resistance of the synchronous rectifier SR. As shown in FIG. 1, a secondary current $I_{SEC}$ flows through the synchronous rectifier SR, which in turn results in a drain-source detecting voltage $V_{DSS}$ between the drain terminal D and the source terminal S of the synchronous rectifier SR. In an embodiment, the synchronous rectifying switching power supply 100 may be an LLC resonant switching power supply, a flyback switching power supply or any other suitable type of switching power supply. Yet in another embodiment, the synchronous rectifier SR may be an N-type metal-oxide-semiconductor field effect transistor (NMOSFET).

Figure 2:
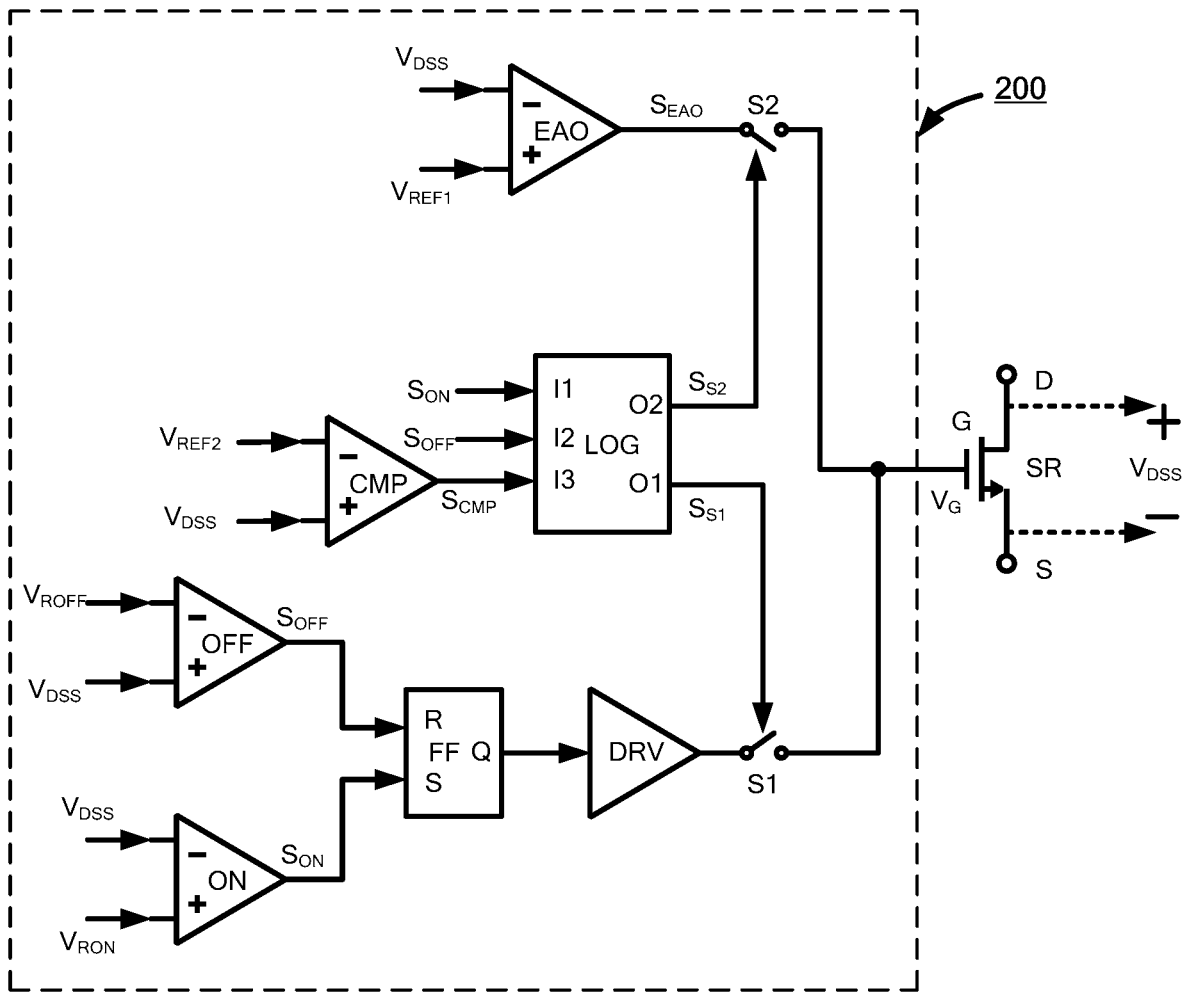
FIG. 2 illustrates a driving circuit 200 used as the driving circuit DR of the synchronous rectifying switching power supply 100 in accordance with an embodiment of the present invention.

FIG. 2 illustrates a driving circuit 200 used as the driving circuit DR of the synchronous rectifying switching power supply 100 in accordance with an embodiment of the present invention.

As shown in FIG. 2, the driving circuit 200 is configured to comprise an amplifying circuit EAO and a comparison circuit CMP. The amplifying circuit EAO comprises a first input terminal, a second input terminal and an output terminal, wherein the first input terminal of the amplifying circuit EAO is configured to receive the drain-source detecting voltage $V_{DSS}$, the second input terminal of the amplifying circuit EAO is configured to receive a first reference voltage $V_{REF1}$, the output terminal of the amplifying circuit EAO is electrically coupled to the gate terminal G of the synchronous rectifier SR. The amplifying circuit EAO operates to output an amplifying signal $S_{EAO}$ at the output terminal of the amplifying circuit EAO based on amplifying the difference between the first reference voltage $V_{REF1}$ and the drain-source detecting voltage $V_{DSS}$ and. In an embodiment, the first input terminal and the second input terminal of the amplifying circuit EAO are respectively an inverting input terminal (−) and a non-inverting input terminal (+).

The comparison circuit CMP comprises a first input terminal, a second input terminal and an output terminal, wherein the first input terminal of the comparison circuit CMP is configured to receive the drain-source detecting voltage $V_{DSS}$, the second input terminal of the comparison circuit CMP is configured to receive a second reference voltage $V_{REF2}$, and the comparison circuit CMP is configured to output a comparison signal $S_{CMP}$ at the output terminal of the comparison circuit CMP based on comparing the drain-source detecting voltage $V_{DSS}$ with the second reference voltage $V_{REF2}$ so as to control whether the amplifying signal $S_{EAO}$ is provided to the gate terminal G of the synchronous rectifier SR or not, and wherein the second reference voltage $V_{REF2}$ is larger than the first reference voltage $V_{REF1}$. More specifically, the amplifying signal $S_{EAO}$ is provided to the gate terminal G of the synchronous rectifier SR when the drain-source detecting voltage $V_{DSS}$ is larger than the second reference voltage $V_{REF2}$, and the amplifying signal $S_{EAO}$ is not provided to the gate terminal G of the synchronous rectifier SR when the drain-source detecting voltage $V_{DSS}$ is lower than the second reference voltage $V_{REF2}$. In an embodiment, the first input terminal and the second input terminal of the comparison circuit CMP are respectively a non-inverting input terminal (+) and an inverting input terminal (−).

Continue referring to FIG. 2, the driving circuit 200 may further comprise an off comparison circuit OFF which comprises a first input terminal, a second input terminal and an output terminal. The first input terminal of the off comparison circuit OFF is configured to receive the drain-source detecting voltage $V_{DSS}$, the second input terminal of the off comparison circuit OFF is configured to receive an off reference voltage $V_{ROFF}$, and the off comparison circuit OFF operates to output an off signal $S_{OFF}$ at the output terminal of the off comparison circuit OFF based on comparing the drain-source detecting voltage $V_{DSS}$ with the off reference voltage $V_{ROFF}$ and so as to control the turn-off of the synchronous rectifier SR. More specifically, the synchronous rectifier SR is turned off when the off signal $S_{OFF}$ is in an activated state; and the synchronous rectifier SR is not controlled by the off signal $S_{OFF}$ when the off signal $S_{OFF}$ is in a non-activated state. The off reference voltage $V_{ROFF}$ is larger than the second reference voltage $V_{REF2}$. In more detail, when the drain-source detecting voltage $V_{DSS}$ is larger than the off reference voltage $V_{ROFF}$, the off signal $S_{OFF}$ is in the activated state, and the synchronous rectifier SR is thus turned off. When the drain-source detecting voltage $V_{DSS}$ is lower than the off reference voltage $V_{ROFF}$, the off signal $S_{OFF}$ is in the non-activated state, and the synchronous rectifier SR is thus not controlled by the off signal $S_{OFF}$. In an embodiment, the first input terminal and the second input terminal of the off comparison circuit OFF are respectively a non-inverting input terminal (+) and an inverting input terminal (−).

Still refer to FIG. 2, the driving circuit 200 may further comprise an on comparison circuit ON. The on comparison circuit ON is configured to comprise a first input terminal, a second input terminal and an output terminal, wherein the first terminal of the on comparison circuit ON is configured to receive the drain-source detecting voltage $V_{DSS}$, the second input terminal of the on comparison circuit ON is configured to receive an on reference voltage $V_{RON}$, the on comparison circuit ON operates to output an on signal $S_{ON}$ at the output terminal of the on comparison circuit ON based on comparing the drain-source detecting voltage $V_{DSS}$ with the on reference voltage $V_{RON}$ so as to control the turn-on of the synchronous rectifier SR. In more detail, the synchronous rectifier SR is turned on when the on signal $S_{ON}$ is in an activated state, and the synchronous rectifier SR is not controlled by the on signal $S_{ON}$ when the on signal $S_{ON}$ is in a non-activated state. The on reference voltage $V_{RON}$ is lower than the first reference voltage $V_{REF1}$. More specifically, when the drain-source detecting voltage $V_{DSS}$ is lower than the on reference voltage $V_{RON}$, the on signal $S_{ON}$ in in its activated state, and the synchronous rectifier SR is thus turned on; when the drain-source detecting voltage $V_{DSS}$ is larger than the on reference voltage $V_{RON}$, the on signal $S_{ON}$ is in its non-activated state, and the synchronous rectifier SR is thus not controlled by the on signal $S_{ON}$. In an embodiment, the first terminal and the second terminal of the on comparison circuit ON are respectively an inverting input terminal (−) and a non-inverting input terminal (+).

In the embodiment in which the off comparison circuit OFF and the on comparison circuit ON are comprised, the driving circuit 200 may further comprise a RS flip-flop FF, a driver DRV, a first switch S1, a second switch S2 and a logic circuit LOG. As shown in FIG. 2, the RS flip-flop FF comprises a set terminal S, a reset terminal R and an output terminal Q, wherein the set terminal S is electrically coupled to the output terminal of the on comparison circuit ON to receive the on signal $S_{ON}$, and the reset terminal R is electrically coupled to the output terminal of the off comparison circuit OFF to receive the off signal $S_{OFF}$. The driver DRV comprises an input terminal and an output terminal, wherein the input terminal of driver DRV is electrically coupled to the output terminal Q of the RS flip-flop FF to receive the signal output by the RS flip-flop FF. The first switch S1 comprises a first terminal, a second terminal and a control terminal, wherein the first terminal of the first switch S1 is electrically coupled to the output terminal of the driver DRV to receive the signal output by the driver DRV, and the second terminal of the driver DRV is electrically coupled to the gate terminal G of the synchronous rectifier SR. The second switch S2 comprises a first terminal, a second terminal and a control terminal, wherein the first terminal of the second switch S2 is electrically coupled to the output terminal of the amplifying circuit EAO to receive the amplifying signal $S_{EAO}$, and the second terminal of the second switch S2 is electrically coupled to the gate terminal G of the synchronous rectifier SR. The logic circuit LOG comprises a first input terminal I1, a second input terminal I2, a third input terminal I3, a first output terminal O1 and a second output terminal O2. The first input terminal I1 is electrically coupled to the on comparison circuit ON to receive the on signal $S_{ON}$, the second input terminal I2 is electrically coupled to the off comparison circuit OFF to receive the off signal $S_{OFF}$, the third input terminal I3 is electrically coupled to the comparison circuit CMP to receive the comparison signal $S_{CMP}$, the first output terminal O1 is configured to provide a first control signal $S_{S1}$ to the control terminal of the first switch S1 to control the turn-on or turn-off of the first switch S1, the second output terminal O2 is configured to provide a second control signal $S_{S2}$ to the control terminal of the second switch S2 to control the turn-on or turn-off of the second switch S2, wherein the first control signal $S_{S1}$ and the second control signal $S_{S2}$ are complementary, namely, the second control signal $S_{S2}$ is the inverting signal of the first control signal $S_{S1}$. The first control signal $S_{S1}$ is in an activated state and the second control signal $S_{S2}$ is in a non-activated state when the off signal $S_{OFF}$ is in its activated state, namely, when the drain-source detecting voltage $V_{DSS}$ is larger than the off reference voltage $V_{ROFF}$. As a result, on one hand, the first control signal $S_{S1}$ turns on the first switch S1 and the second control signal $S_{S2}$ turns off the second switch S2, and the gate terminal G of the synchronous rectifier the synchronous rectifier SR thus receives the output signal of the driver DRV and the synchronous rectifier SR is controlled by the output signal of the driver DRV. On the other hand, as the off signal $S_{OFF}$ is in its activated state, the RS flip-flop FF is reset and provides a logic low signal (0) to the driver, and the driver DRV accordingly provides a logic low signal (0) to the gate terminal G of the synchronous rectifier SR to turn off the synchronous rectifier SR.

Persons of ordinary skill in the art will recognize that, when the off signal $S_{OFF}$ is in its activated state, the drain-source detecting voltage $V_{DSS}$ is larger than the off reference voltage $V_{ROFF}$, thus accordingly, the comparison signal $S_{CMP}$ is in its activated state and the on signal $S_{ON}$ is in its non-activated state as the drain-source detecting voltage $V_{DSS}$ is certainly larger than the second reference voltage $V_{REF2}$ and the on reference voltage $V_{RON}$. However, under this situation, the comparison signal $S_{CMP}$ and the on signal $S_{ON}$ will be override by the activated off signal $S_{OFF}$. When the comparison signal $S_{CMP}$ is in its activated state and the off signal $S_{OFF}$ is in its non-activated state, the second control signal $S_{S2}$ is in its activated state and the first control signal $S_{S1}$ is in its non-activated state. Under this situation, on one hand, the second switch S2 is turned on by the second control signal $S_{S2}$ and the first switch S1 is turned off by the first control signal $S_{S1}$, the gate terminal G of the synchronous rectifier SR receives the amplifying signal $S_{EAO}$ output by the amplifying circuit EAO and the synchronous rectifier SR is thus controlled by the amplifying signal $S_{EAO}$. More specifically, the amplifying signal $S_{EAO}$ operates to regulate the value of the on-resistance of the synchronous rectifier SR, thus to regulate the drain-source detecting voltage $V_{DSS}$ so that the drain-source detecting voltage $V_{DSS}$ is maintained regulated at the first reference voltage $V_{REF1}$. Persons of ordinary skill in the art will recognize that, when the comparison signal $S_{CMP}$ is in its activated state and the off signal $S_{OFF}$ is in its non-activated state, the drain-source detecting voltage $V_{DSS}$ is certainly larger than the on reference voltage $V_{RON}$, namely, the on signal $S_{ON}$ is in its non-activated state, as the drain-source detecting voltage $V_{DSS}$ is larger than the second reference voltage $V_{REF2}$. However, under this situation, the on signal $S_{ON}$ is override by the activated comparison signal $S_{CMP}$ and the non-activated off signal $S_{OFF}$, that is, the first control signal $S_{S1}$ and the second control signal $S_{S2}$ are relevant to the activated comparison signal $S_{CMP}$ and the non-activated off signal $S_{OFF}$ other than the on signal $S_{ON}$. In an embodiment, the activated state refers to a logic high state (1) and the non-activated state refers to a logic low state (0).

Figure 3:
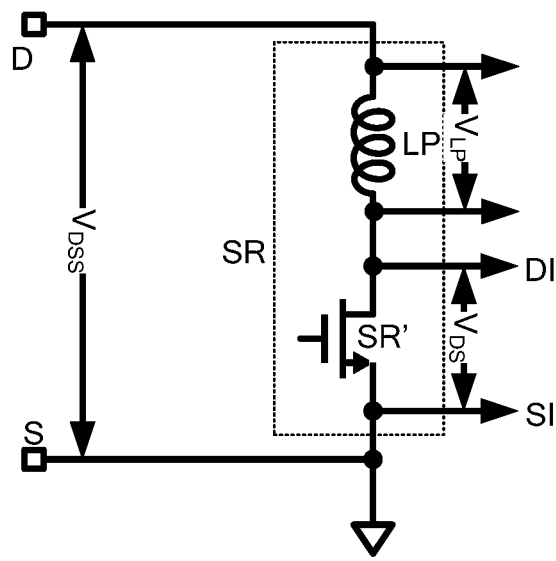
FIG. 3 illustrates the relationship between the real drain-source voltage $V_{DS}$ and the drain-source detecting voltage $V_{DSS}$ of the synchronous rectifier SR.

FIG. 3 illustrates the relationship between the real drain-source voltage $V_{DS}$ and the drain-source detecting voltage $V_{DSS}$ of the synchronous rectifier SR. As shown in FIG. 3, in operation, the synchronous rectifier SR can be equivalent to an ideal transistor SR' and a parasitic inductor LP which are serially coupled. Ideally, when the real drain-source voltage $V_{DS}$ reaches the off reference voltage $V_{ROFF}$, the synchronous rectifier SR is turned off. But in operation, it is the drain-source detecting voltage $V_{DSS}$ that is compared with the off reference voltage $V_{ROFF}$, and the synchronous rectifier SR is turned off when the drain-source detecting voltage $V_{DSS}$ reaches the off reference voltage $V_{ROFF}$. And the drain-source detecting voltage $V_{DSS}$ between the drain terminal D and the source terminal S of the synchronous rectifier SR is the sum of the real drain-source voltage $V_{DS}$ between the drain terminal DI of the ideal transistor SR' and the parasitic voltage $V_{LP}$ across the parasitic inductor LP, as shown in equation (1):

$$V_{DSS}=V_{DS}+V_{LP} \quad (1)$$

wherein the parasitic voltage $V_{LP}$ can be expressed as below in equation (2):

$$V_{LP}=L_{LP}*di/dt \quad (2)$$

wherein $L_{LP}$ represents the inductance of the parasitic inductor LP, di/dt represents the change rate of the current flowing through the parasitic inductor LP.

As a result, as the drain-source detecting voltage $V_{DSS}$ is larger than the real drain-source voltage $V_{DS}$, especially when di/dt is large, the synchronous rectifier SR cannot be regulated promptly and is turned off ahead of the ideal turn-off moment.

Figure 4:
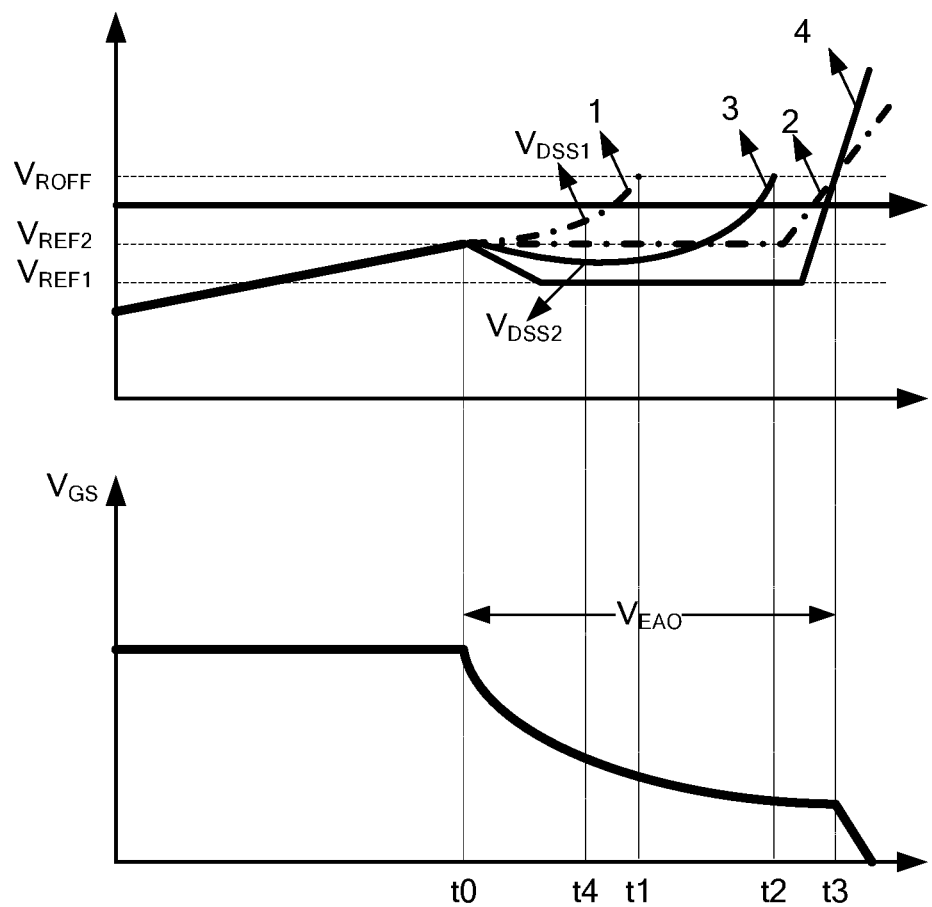
FIG. 4 illustrates the waveforms of the drain-source detecting voltage $V_{DSS}$ and the real drain-source voltage $V_{DS}$ when the drain-source detecting voltage $V_{DSS}$ is respectively regulated at the first reference voltage $V_{REF1}$ and the second reference voltage $V_{REF2}$ since the drain-source detecting voltage $V_{DSS}$ reaches the second reference voltage $V_{REF2}$.

FIG. 4 illustrates the waveforms of the drain-source detecting voltage $V_{DSS}$ and the real drain-source voltage $V_{DS}$ when the drain-source detecting voltage $V_{DSS}$ is respectively regulated at the first reference voltage $V_{REF1}$ and the second reference voltage $V_{REF2}$ since the drain-source detecting voltage $V_{DSS}$ reaches the second reference voltage $V_{REF2}$. Curve 1 represents the real drain-source detecting voltage $V_{DSS}$ when it is regulated at the second reference voltage $V_{REF2}$ since the moment t0 at which the drain-source detecting voltage $V_{DSS}$ reaches the second reference voltage $V_{REF2}$. Curve 2 represents the ideal drain-source voltage $V_{DSS}$ when the drain-source detecting voltage $V_{DSS}$ is regulated at the second reference voltage $V_{REF2}$ since the moment t0 at which the drain-source detecting voltage $V_{DSS}$ reaches the second reference voltage $V_{REF2}$. Curve 3 represents the real drain-source detecting voltage $V_{DSS}$ when it is regulated at the first reference voltage $V_{REF1}$ since the moment t0 at which the drain-source detecting voltage $V_{DSS}$ reaches the second reference voltage $V_{REF2}$. Curve 4 represents the ideal drain-source voltage $V_{DSS}$ when the drain-source detecting voltage $V_{DSS}$ is regulated at the first reference voltage $V_{REF1}$ since the moment t0 at which the drain-source detecting voltage $V_{DSS}$ reaches the second reference voltage $V_{REF2}$.

The operation of the driving circuit 200 will now be set forth with reference to FIG. 2 and FIG. 4. As shown in FIG. 2 and FIG. 4, as the secondary current $I_{SEC}$ reduces, the drain-source detecting voltage $V_{DSS}$ increases gradually, and at moment t0, the drain-source detecting voltage $V_{DSS}$ increases to the second reference voltage $V_{REF2}$, thus, the comparison signal $S_{CMP}$ transits to the activated state (logic high 1). On the other hand, as the drain-source detecting voltage $V_{DSS}$ is still lower than the off reference voltage $V_{ROFF}$, the off signal $S_{OFF}$ is in its non-activated state (logic low 0), thus, the second control signal $S_{S2}$ is in its activated state (logic high 1) and the first control signal $S_{S1}$ is in its non-activated state (logic low 0). As a result, the second switch S2 is turned on by the second control signal $S_{S2}$ and the first switch S1 is turned off by the first control signal $S_{S1}$, and the gate terminal G of the synchronous rectifier SR receives the amplifying signal $S_{EAO}$ output by the amplifying circuit EAO and the synchronous rectifier SR is controlled by the amplifying signal $S_{EAO}$.

More specifically, as the drain-source detecting voltage $V_{DSS}$ increases, the difference between the first reference voltage $V_{REF1}$ and the drain-source detecting voltage $V_{DSS}$ becomes lower, and accordingly the amplifying signal $S_{EAO}$ becomes lower and the on-resistance of the synchronous rectifier SR increases. Thus, the increase of the drain-source detecting voltage $V_{DSS}$ due to the reduction of the secondary current $I_{SEC}$ is reduced or eliminated, regulating the drain-source detecting voltage $V_{DSS}$ at the first reference voltage $V_{REF1}$. The driving voltage applied at the gate terminal G of the synchronous rectifier SR is lowered to a relatively low level before the synchronous rectifier SR is turned off, which in turn helps to improve the speed of the turn-off of the synchronous rectifier SR. As shown by curve 3, as the drain-source detecting voltage $V_{DSS}$ increases, at moment t2, the drain-source detecting voltage $V_{DSS}$ reaches the off reference voltage $V_{ROFF}$, and consequently, the off signal $S_{OFF}$ transits to the activated state (logic high 1), and in turn, the first control signal $S_{S1}$ transits to its activated state (logic high 1) and the second control signal $S_{S2}$ transits to its non-activated state (logic low 0). As a result, on one hand, the first switch S1 is turned on by the first control signal $S_{S1}$ and the second switch S2 is turned off by the second control signal $S_{S2}$, thus, the gate terminal G of the synchronous rectifier SR receives the signal output by the driver DRV so that the synchronous rectifier SR is controlled by the output signal output by the driver DRV. On the other hand, the activated state of the off signal $S_{OFF}$ resets the RS flip-flop FF and the RS flip-flop FF thus outputs a logic low signal (0) to the driver DRV which in turn outputs a logic low signal (0) to the gate terminal G of the synchronous rectifier SR. Consequently, the synchronous rectifier SR is turned off.

Figure 5:
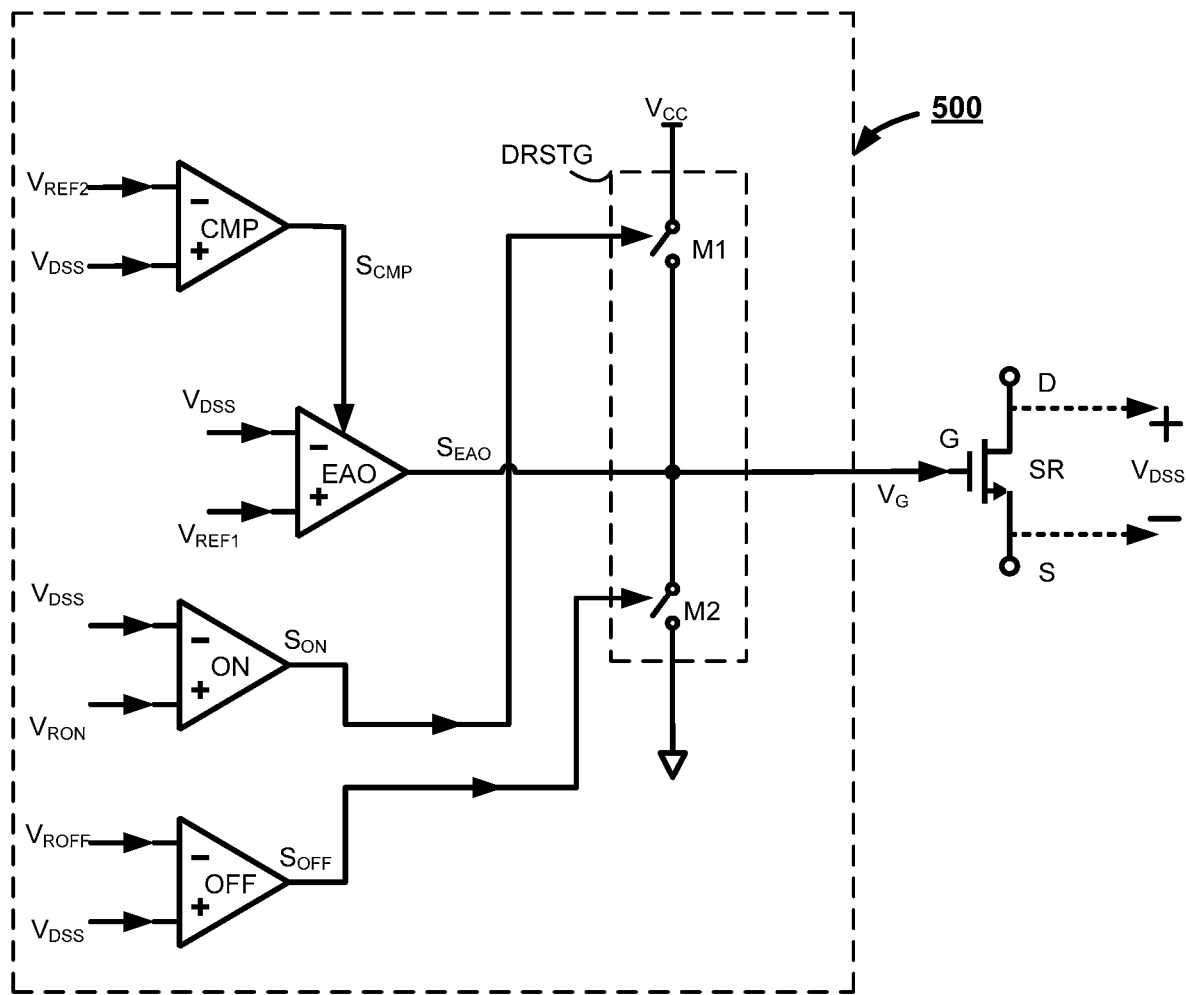
FIG. 5 illustrates a driving circuit 500 used as the driving circuit DR of the synchronous rectifying switching power supply 100 of FIG. 1 in accordance with an embodiment of the present invention.

FIG. 5 illustrates a driving circuit 500 used as the driving circuit DR of the synchronous rectifying switching power supply 100 of FIG. 1 in accordance with an embodiment of the present invention. The driving circuit 500 of FIG. 5 has a similar configuration as that of the driving circuit 200 of FIG. 2, except that the RS flip-flop FF, the driver DRV, the first switch S1, the second switch S2 and the logic circuit LOG in FIG. 2 are all replaced by the driving stage DRSTG of FIG. 5, wherein the driving stage DRSTG comprises a high-side switch M1 and a low-side switch M2. The high-side switch M1 comprises a first terminal, a second terminal and a control terminal, wherein the first terminal of the high-side switch M1 is electrically coupled to a power supply VCC, the control terminal of the high-side switch M1 is electrically coupled to the output terminal of the on comparison circuit ON to receive the on signal $S_{ON}$. The low-side switch M2 comprises a first terminal, a second terminal and a control terminal, wherein the first terminal of the low-side switch M2 is electrically coupled to the second terminal of the high-side switch M1, the second terminal of the low-side switch M2 is electrically coupled to the reference ground, and the control terminal of the low-side switch M2 is electrically coupled to the output terminal of the off comparison circuit OFF to receive the off signal $S_{OFF}$. The gate terminal G of the synchronous rectifier SR is electrically coupled to the second terminal of the high-side switch M1, the first terminal of the low-side switch M2 and the output terminal of the amplifying circuit EAO. In addition, in the driving circuit 500 in FIG. 5, the amplifying circuit EAO comprises a control terminal which is electrically coupled to the output terminal of the comparison circuit CMP to receive the comparison signal $S_{CMP}$, and the amplifying circuit EAO is allowed to provide the amplifying signal $S_{EAO}$ when the comparison signal $S_{CMP}$ is in its activated state, and the amplifying circuit EAO is not allowed to provide the amplifying signal $S_{EAO}$ when the comparison signal $S_{CMP}$ is in its non-activated state.

In operation, when the drain-source detecting voltage $V_{DSS}$ is lower than the on reference voltage $V_{RON}$, the on signal $S_{ON}$ is in its activated state and the high-side switch M1 is turned on. Meanwhile, when the drain-source detecting voltage $V_{DSS}$ is lower than the on reference voltage $V_{RON}$, the drain-source detecting voltage $V_{DSS}$ is certainly lower than the off reference voltage $V_{ROFF}$, the off signal $S_{OFF}$ is in its non-activated state, the low-side switch M2 is turned off, as a result, the gate terminal G of the synchronous rectifier SR is electrically coupled to the power supply VCC, and the synchronous rectifier SR is turned on. When the drain-source detecting voltage $V_{DSS}$ is larger than the off reference voltage $V_{ROFF}$, the off signal $S_{OFF}$ is in its activated state, the low-side switch M2 is turned on. Meanwhile, when the drain-source detecting voltage $V_{DSS}$ is larger than the off reference voltage $V_{ROFF}$, the drain-source detecting voltage $V_{DSS}$ is certainly larger than the on reference voltage $V_{RON}$, the on signal $S_{ON}$ is in its non-activated state, and the high-side switch M1 is turned off, and the gate terminal G of the synchronous rectifier SR is electrically coupled to the reference ground and the synchronous rectifier SR is turned off. When the drain-source detecting voltage $V_{DSS}$ is larger than the second reference voltage $V_{REF2}$ and lower than the off reference voltage $V_{ROFF}$, on one hand, the comparison signal $S_{CMP}$ is in its activated state, which in turn enables the amplifying circuit EAO so that the amplifying circuit EAO outputs the amplifying signal $S_{EAO}$, on the other hand, when the drain-source detecting voltage $V_{DSS}$ is larger than the second reference voltage $V_{REF2}$ and lower than the off reference voltage $V_{ROFF}$, the drain-source detecting voltage $V_{DSS}$ is certainly larger than the on reference voltage $V_{RON}$, thus, the on signal $S_{ON}$ and the off signal $S_{OFF}$ are both in the non-activated state, and the driving stage DRSTG is in a high-z state, the gate terminal G of the synchronous rectifier SR is electrically coupled to the output terminal of the amplifying circuit EAO to receive the amplifying signal $S_{EAO}$, and the on-resistance of the synchronous rectifier SR is regulated by the amplifying signal $S_{EAO}$.

The operation of the driving circuit 500 will now be set forth with reference to FIG. 4 and FIG. 5. As shown in FIG. 4 and FIG. 5, as the secondary current $I_{SEC}$ reduces, the drain-source detecting voltage $V_{DSS}$ increases gradually. At moment t0, the drain-source detecting voltage $V_{DSS}$ increase to the second reference voltage $V_{REF2}$, the comparison signal $S_{CMP}$ transits to the activated state (logic high 1) which in turn enables the amplifying circuit EAO and the amplifying circuit EAO outputs the amplifying signal $S_{EAO}$. At this moment, as the drain-source detecting voltage $V_{DSS}$ is lower than the off reference voltage $V_{ROFF}$, the off signal $S_{OFF}$ is in its non-activated state (logic low 0), the low-side switch M2 is turned off; and as the drain-source detecting voltage $V_{DSS}$ is larger than the on reference voltage $V_{RON}$, the on signal $S_{ON}$ is in its non-activated state (logic low 0), the high-side switch M1 is turned off, thus, the gate terminal G of the synchronous rectifier SR receives the amplifying signal $S_{EAO}$ output by the amplifying circuit EAO and the synchronous rectifier SR is controlled by the amplifying signal $S_{EAO}$. More specifically, as the drain-source detecting voltage $V_{DSS}$ increases, the difference between the first reference voltage $V_{REF1}$ and the drain-source detecting voltage $V_{DSS}$ reduces, the amplifying signal $S_{EAO}$ becomes lower, causing the on-resistance of the synchronous rectifier SR to increase, which in turn reduces or eliminates the increase of the drain-source detecting voltage $V_{DSS}$ due to the reduction of the secondary current $I_{SEC}$, regulating the drain-source detecting voltage $V_{DSS}$ at the first reference voltage $V_{REF1}$. The driving voltage applied at the gate terminal G of the synchronous rectifier SR is lowered to a relatively low level before the synchronous rectifier SR is turned off, which in turn helps to improve the speed of the turn-off of the synchronous rectifier SR. This is because that before the drain-source detecting voltage $V_{DSS}$ reaches the second reference voltage $V_{REF2}$, the gate terminal G of the synchronous rectifier SR is electrically coupled to the high level power supply VCC, which helps to improve the system efficiency. As the drain-source detecting voltage $V_{DSS}$ increase slowly anyway, as shown by curve 3, at moment t2, the drain-source detecting voltage $V_{DSS}$ reaches the off reference voltage $V_{ROFF}$, the off signal $S_{OFF}$ transits to the activated state (logic high 1), the low-side switch M2 is turned on, and the gate terminal G of the synchronous rectifier SR is electrically coupled to the reference ground and the synchronous rectifier SR is turned off.

As shown in FIG. 4, moment t1 represents the moment at which the drain-source detecting voltage $V_{DSS}$ reaches the off reference voltage $V_{ROFF}$ in the traditional scheme where the drain-source detecting voltage $V_{DSS}$ is regulated at the second reference voltage $V_{REF2}$ when the drain-source detecting voltage $V_{DSS}$ reaches the second reference voltage $V_{REF2}$; moment t2 represents the moment at which the drain-source detecting voltage $V_{DSS}$ reaches the off reference voltage $V_{ROFF}$ in the embodiments of the present invention where the drain-source detecting voltage $V_{DSS}$ is regulated at the first reference voltage $V_{REF1}$ when the drain-source detecting voltage $V_{DSS}$ reaches the second reference voltage $V_{REF2}$; and moment t3 represents the ideal turn-off moment. As can be observed from FIG. 4, the moment t2 is closer to the ideal turn-off moment t3 than the moment t1 is. That is, compared with the traditional scheme when the drain-source detecting voltage $V_{DSS}$ is regulated at the second reference voltage $V_{REF2}$, in the embodiments in accordance with the present invention, the real turn-off moment is closer to the ideal turn-off moment, which helps to prevent the synchronous rectifier SR from being falsely turned off more efficiently. In another word, at the same moment, such as at the moment t4 shown in FIG. 4, the drain-source detecting voltage $V_{DSS2}$ obtained with the embodiments in accordance with the present invention is lower than the drain-source detecting voltage $V_{DSS1}$ obtained using the prior-art technology, as a result of which, it is more efficient to prevent the synchronous rectifier SR from being turned off ahead of the ideal turn-off moment because of that the drain-source detecting voltage $V_{DSS}$ reaches the off reference voltage $V_{ROFF}$, and thus, when the synchronous rectifier SR is turned off, the secondary current $I_{SEC}$ approaches more closely to zero.

Figure 6:
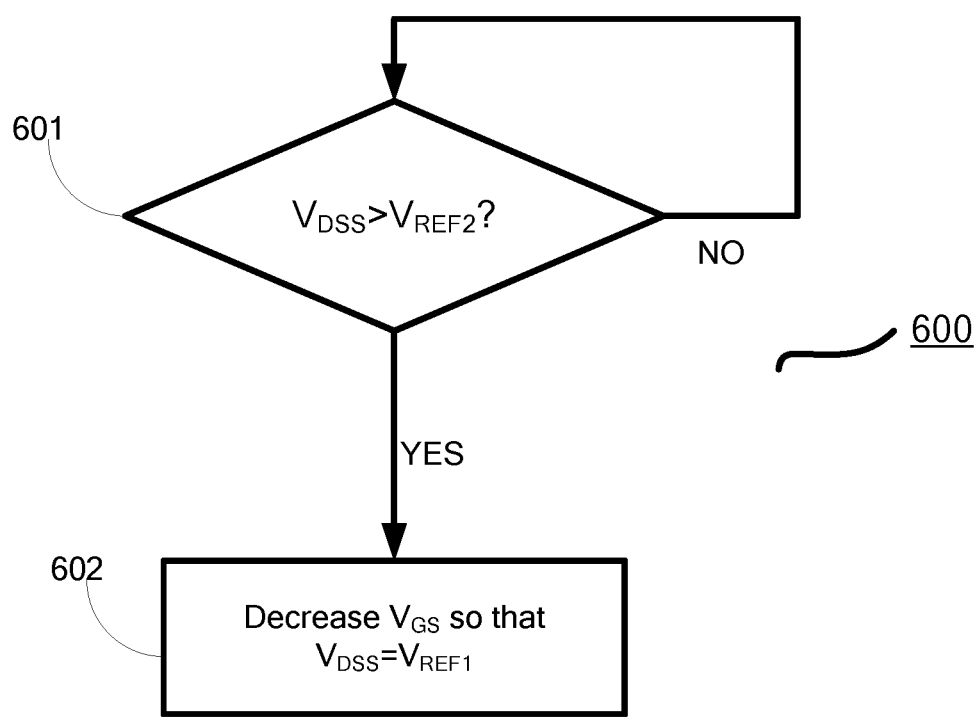
FIG. 6 illustrates a driving method 600 in accordance with an embodiment of the present invention.

FIG. 6 illustrates a driving method 600 in accordance with an embodiment of the present invention. Similarly to the embodiment of FIG. 1, in the embodiment of FIG. 6, a synchronous rectifier SR comprises a drain terminal D, a source terminal S and a gate terminal G, and there exists a drain-source detecting voltage $V_{DSS}$ between the drain terminal D and the source terminal S of the synchronous rectifier SR, the gate terminal G is driven by a gate voltage $V_{GS}$. The driving method 600 comprises steps 601 and 602. In step 601, judge if the drain-source detecting voltage $V_{DSS}$ reaches a second reference voltage $V_{REF2}$ or not, if yes, step 602 is performed. In step 602, the gate voltage $V_{GS}$ of the synchronous rectifier SR is lowered down so as to regulate the drain-source detecting voltage $V_{DSS}$ at a first reference voltage $V_{REF1}$, wherein the first reference voltage $V_{REF1}$ is lower than the second reference voltage $V_{REF2}$.

In an embodiment, the driving method 600 may further comprise a step of turning off the synchronous rectifier SR when the drain-source detecting voltage $V_{DSS}$ reaches an off reference voltage $V_{ROFF}$, wherein the off reference voltage $V_{ROFF}$ is larger than the second reference voltage $V_{REF2}$. In another embodiment, the driving method 600 may further comprise a step of turning on the synchronous rectifier SR when the drain-source detecting voltage $V_{DSS}$ reaches the on reference voltage $V_{RON}$, wherein the on reference voltage $V_{RON}$ is lower than the first reference voltage $V_{REF1}$.

It will be appreciated by persons skilled in the art that the present invention is not limited to what has been particularly shown and described herein above. Rather the scope of the present invention is defined by the claims and includes both combinations and sub-combinations of the various features described hereinabove as well as variations and modifications thereof which would occur to persons skilled in the art upon reading the foregoing description and which are not in the prior art.

What is claimed is:

1. A driving circuit for driving a synchronous rectifier, wherein the synchronous rectifier is configured to comprise a drain terminal, a source terminal and a gate terminal, and a drain-source detecting voltage exists between the drain terminal and the source terminal, and wherein the driving circuit is configured to regulate the drain-source detecting voltage at a first reference voltage when the drain-source detecting voltage reaches a second reference voltage, wherein the first reference voltage is lower than the second reference voltage.

2. The driving circuit of claim 1, wherein the driving circuit is configured to regulate the drain-source detecting voltage at the first reference voltage by decreasing the driving voltage applied at the gate terminal.

3. The driving circuit of claim 1, wherein the driving circuit comprises:
an amplifying circuit having a first input terminal, a second input terminal and an output terminal, wherein the first input terminal is configured to receive the drain-source detecting voltage, the second input terminal is configured to receive the first reference voltage, and the output terminal is electrically coupled to the gate terminal of the synchronous rectifier, and wherein the amplifying circuit is configured to provide an amplifying signal at the output terminal based on amplifying the difference between the first reference voltage and the drain-source detecting voltage; and
a comparison circuit having a first input terminal, a second input terminal and an output terminal, wherein the first input terminal is configured to receive the drain-source detecting voltage, the second input terminal is configured to receive the second reference voltage, and the comparison circuit is configured to generate a comparison signal at the output terminal based on comparing the drain-source detecting voltage with the second reference voltage and to control whether the amplifying signal is provided to the gate terminal of the synchronous rectifier or not.

4. The driving circuit of claim 3, wherein the amplifying signal is provided to the gate terminal of the synchronous rectifier when the drain-source detecting voltage is larger than the second reference voltage, and the amplifying signal is not provided to the gate terminal of the synchronous rectifier when the drain-source detecting voltage is lower than the second reference voltage.

5. The driving circuit of claim 3, wherein the driving circuit further comprises an off comparison circuit having a first input terminal, a second input terminal, and an output terminal, and wherein the first input terminal is configured to receive the drain-source detecting voltage, the second input terminal is configured to receive an off reference voltage, and the output terminal is electrically coupled to the gate terminal of the synchronous rectifier, and wherein the off comparison circuit is configured to generate an off signal at the output terminal based on comparing the drain-source detecting voltage with the off reference voltage and to control the turn-off of the synchronous rectifier, and wherein the off reference voltage is larger than the second reference voltage.

6. The driving circuit of claim 5, wherein the synchronous rectifier is turned off by the off signal when the drain-source detecting voltage is larger than the off reference voltage.

7. The driving circuit of claim 5, wherein the driving circuit further comprises an on comparison circuit having a first input terminal, a second input terminal, and an output terminal, and wherein the first input terminal is configured to receive the drain-source detecting voltage, the second input terminal is configured to receive an on reference voltage, and the output terminal is electrically coupled to the gate terminal of the synchronous rectifier, and wherein the on comparison circuit is configured to generate an on signal at the output terminal based on comparing the drain-source detecting voltage with the on reference voltage and to control the turn-on of the synchronous rectifier, and wherein the on reference voltage is lower than the first reference voltage.

8. The driving circuit of claim 7, wherein the synchronous rectifier is turned on by the on signal when the drain-source detecting voltage is lower than the on reference voltage.

9. The driving circuit of claim 7, wherein the driving circuit further comprises:
a RS flip-flop having a set terminal, a reset terminal and an output terminal, wherein the set terminal is electrically coupled to the output terminal of the on comparison circuit, and the reset terminal is electrically coupled to the output terminal of the off comparison circuit;
a driver having an input terminal and an output terminal, wherein the input terminal is electrically coupled to the output terminal of the RS flip-flop;
a first switch having a first terminal and a second terminal, wherein the first terminal is electrically coupled to the output terminal of the driver, and the second terminal is electrically coupled to the gate terminal of the synchronous rectifier;
a second switch having a first terminal and a second terminal, wherein the first terminal is electrically coupled to the output terminal of the amplifying circuit, and the second terminal is electrically coupled to the gate terminal of the synchronous rectifier; and a logic circuit having a first input terminal, a second input terminal, a third input terminal, a first output terminal and a second output terminal, the first input terminal is configured to receive the on signal, the second input terminal is configured to receive the off signal, the third input terminal is configured to receive the comparison signal, the first output terminal is configured to output a first control signal to control the first switch, the second output terminal is configured to output a second control signal to control the second switch, and wherein the first control signal is in an activated state when the off signal is in an activated state, and the second control signal is in an activated state when the comparison signal is in an activated state and the off signal is in a non-activated state.

10. The driving circuit of claim 7, wherein the driving circuit further comprises:
a high-side switch having a first terminal, a second terminal and a control terminal, wherein the first terminal is electrically coupled to a power supply, the control terminal is electrically coupled to the output terminal of the on comparison circuit to receive the on signal; and
a low-side switch having a first terminal, a second terminal and a control terminal, wherein the first terminal is electrically coupled to the second terminal, the control terminal is electrically coupled to the output terminal of the off comparison circuit to receive the off signal, and the second terminal is electrically coupled to a reference ground;
wherein the gate terminal of the synchronous rectifier is electrically coupled to the second terminal of the high-side switch, the first terminal of the low-side switch and the output terminal of the amplifying circuit, and wherein the amplifying circuit further has a control terminal electrically coupled to the output terminal of the comparison circuit to receive the comparison signal.

11. A synchronous rectifying switching power supply, comprising:
a primary circuit configured to receive an input signal and to provide a primary signal;
a transformer having a primary winding and a secondary winding, wherein the primary winding is electrically coupled to the primary circuit to receive the primary signal;
a synchronous rectifier electrically coupled between the secondary winding and a load, wherein the synchronous rectifier is configured to comprise a drain terminal, a source terminal and a gate terminal, and a drain-source detecting voltage exists between the drain terminal and the source terminal; and
a driving circuit for driving the synchronous rectifier, wherein the driving circuit is configured to regulate the drain-source detecting voltage at a first reference voltage when the drain-source detecting voltage reaches a second reference voltage, wherein the first reference voltage is lower than the second reference voltage.

12. The synchronous rectifying switching power supply of claim 11, wherein the driving circuit is configured to regulate the drain-source detecting voltage at the first reference voltage by decreasing the driving voltage applied at the gate terminal.

13. The synchronous rectifying switching power supply of claim 11, wherein the driving circuit comprises:
an amplifying circuit having a first input terminal, a second input terminal and an output terminal, wherein the first input terminal is configured to receive the drain-source detecting voltage, the second input terminal is configured to receive the first reference voltage, and the output terminal is electrically coupled to the gate terminal of the synchronous rectifier, and wherein the amplifying circuit is configured to provide an amplifying signal at the output terminal based on amplifying the difference between the first reference voltage and the drain-source detecting voltage; and
a comparison circuit having a first input terminal, a second input terminal and an output terminal, wherein the first input terminal is configured to receive the drain-source detecting voltage, the second input terminal is configured to receive the second reference voltage, and the comparison circuit is configured to generate a comparison signal at the output terminal of the comparison circuit based on comparing the drain-source detecting voltage with the second reference voltage and to control whether the amplifying signal is provided to the gate terminal of the synchronous rectifier or not.

14. The synchronous rectifying switching power supply of claim 13, wherein the amplifying signal is provided to the gate terminal of the synchronous rectifier when the drain-source detecting voltage is larger than the second reference voltage, and the amplifying signal is not provided to the gate terminal of the synchronous rectifier when the drain-source detecting voltage is lower than the second reference voltage.

15. The synchronous rectifying switching power supply of claim 14, wherein the driving circuit further comprises an off comparison circuit having a first input terminal, a second input terminal, and an output terminal, and wherein the first input terminal is configured to receive the drain-source detecting voltage, the second input terminal is configured to receive an off reference voltage, and the output terminal is electrically coupled to the gate terminal of the synchronous rectifier, and wherein the off comparison circuit is configured to generate an off signal at the output terminal of the off comparison circuit based on comparing the drain-source detecting voltage with the off reference voltage and to turn-off the synchronous rectifier when the drain-source detecting voltage is larger than the off reference voltage, and wherein the off reference voltage is larger than the second reference voltage.

16. The synchronous rectifying switching power supply of claim 15, wherein the driving circuit further comprises an on comparison circuit having a first input terminal, a second input terminal, and an output terminal, and wherein the first input terminal is configured to receive the drain-source detecting voltage, the second input terminal is configured to receive an on reference voltage, and the output terminal is electrically coupled to the gate terminal of the synchronous rectifier, and wherein the on comparison circuit is configured to generate an on signal at the output terminal of the on comparison circuit based on comparing the drain-source detecting voltage with the on reference voltage and to turn-on the synchronous rectifier when the drain-source detecting voltage is lower than the on reference voltage, and wherein the on reference voltage is lower than the first reference voltage.

17. A driving method for driving a synchronous rectifier, wherein the synchronous rectifier is configured to comprise a drain terminal, a source terminal and a gate terminal, and a drain-source detecting voltage exists between the drain terminal and the source terminal, and wherein the driving method comprises regulating the drain-source detecting voltage at a first reference voltage when the drain-source detecting voltage reaches a second reference voltage, wherein the first reference voltage is lower than the second reference voltage.

18. The driving method of claim 17, wherein the drain-source detecting voltage is regulated at the first reference voltage by decreasing the driving voltage applied at the gate terminal.

19. The driving method of claim 17, wherein the driving method further comprises turning off the synchronous rectifier when the drain-source detecting voltage reaches an off reference voltage, wherein the off reference voltage is larger than the second reference voltage.

20. The driving method of claim 17, wherein the driving method further comprises turning on the synchronous rectifier when the drain-source detecting voltage reaches an on reference voltage, wherein the on reference voltage is lower than the first reference voltage.

\* \* \* \* \*